(12) United States Patent
Van De Ven

(10) Patent No.: US 7,167,233 B2
(45) Date of Patent: Jan. 23, 2007

(54) LITHOGRAPHIC APPARATUS, DEVICE MANUFACTURING METHOD AND APPARATUS FOR PROCESSING AN EXCHANGEABLE OBJECT

(75) Inventor: Bastiaan Laambertus Wilhelmus Marinus Van De Ven, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 53 days.

(21) Appl. No.: 10/944,429

(22) Filed: Sep. 20, 2004

(65) Prior Publication Data

US 2006/0061750 A1 Mar. 23, 2006

(51) Int. Cl.
*G03B 27/58* (2006.01)
*G03B 27/62* (2006.01)

(52) U.S. Cl. .......................................... 355/72; 355/75
(58) Field of Classification Search ................. 355/53, 355/72, 75, 77; 483/13; 901/9, 47
See application file for complete search history.

(56) References Cited

U.S. PATENT DOCUMENTS

| | | | | |
|---|---|---|---|---|
| 3,543,947 A | * | 12/1970 | Devol | ........................ 414/733 |
| 5,570,992 A | * | 11/1996 | Lemelson | ................. 414/744.3 |
| 5,895,923 A | * | 4/1999 | Blake | ..................... 250/492.21 |
| 5,905,850 A | * | 5/1999 | Kaveh | .......................... 700/259 |
| 2003/0045205 A1 | * | 3/2003 | Herb et al. | ..................... 451/5 |
| 2004/0201231 A1 | * | 10/2004 | Stacey | ......................... 294/1.1 |

* cited by examiner

*Primary Examiner*—Rodney Fuller
(74) *Attorney, Agent, or Firm*—Pillsbury Winthrop Shaw Pittman, LLP

(57) ABSTRACT

The present invention relates to a lithographic apparatus including an illumination system configured to condition a beam of radiation, a support structure configured to support a patterning device, the patterning device configured to pattern the beam of radiation, a substrate table configured to hold a substrate, a projection system configured to project the patterned beam onto a target portion of the substrate, and a robot configured to exchange the exchangeable object. The robot includes a base part and a movable part, the movable part being moveably connected to the base part and including an object handler configured to handle the exchangeable object. The apparatus further includes an object detector configured to detect the exchangeable object in the object handler, the object detector including a transmitter configured to transmit a signal and a receiver configured to receive a signal, the transmitter and the receiver being positioned separately from the movable part of the robot.

26 Claims, 3 Drawing Sheets

LITHOGRAPHIC APPARATUS, DEVICE MANUFACTURING METHOD AND APPARATUS FOR PROCESSING AN EXCHANGEABLE OBJECT

BACKGROUND

1. Field of the Invention

The present invention relates to a lithographic apparatus, a device manufacturing method and an apparatus for processing an exchangeable object.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Conventional lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In a conventional lithographic apparatus a robot is used to exchange an exchangeable object. Examples of such exchangeable objects are substrates, which are exchanged for subsequent illumination, and patterning devices or masks which are exchanged for providing different patterns when illuminating the substrates.

A conventional robot generally includes a base part which is connected with usually a stationary part of the lithographic apparatus, and a movable part which may include a number of arms which are interlinked. A proximal end of the movable part is movably connected to the base part. On a distal end of the movable part, an object handler for holding an exchangeable object, for instance a substrate, is arranged.

The lithographic apparatus generally includes a sensor which is arranged on the object handler and which can detect the presence of an object in the object handler. It is desirable to detect the presence of an object in the object handler to make sure that the objects are handled properly. With the use of a signal provided by the sensor, it is possible, for example, to check that there is no object present in the object handler before a new object is taken by the object handler. In this way damage to the objects may be avoided.

In a conventional robot of the above-mentioned type, cabling is routed from the base part to the object handler to energize the sensor and to connect the sensor to a computer or such device to process the signal. The cabling is usually guided along the arms of the robot in order to avoid that the cabling can become caught between moving parts of the robot or other parts of the lithographic apparatus. As a result of the cabling being guided along the arms of the robot, the freedom of movement, e.g. a rotation, of the robot is limited. Additionally, the movement of the cables may cause particle generation near the exchangeable object, which in general is undesired.

Moreover, when the robot is used in a process chamber where a certain process environment is kept, for example, a vacuum chamber, the use of cabling in the process chamber leads to a number of further difficulties. The presence of cabling in the process environment may lead to outgassing of the cabling material and can have an undesired influence on the temperature in the process environment. Further, the feed-through of the cabling through the wall of the process chamber makes it necessary to provide a sealing for this feed-through.

SUMMARY OF THE INVENTION

Embodiments of the invention include a lithographic apparatus including a robot for exchanging an exchangeable object and a detection device or object detector configured to detect an exchangeable object in an object handler of the robot, wherein the freedom of movement of a movable part of the robot is not limited by the presence of cabling for the detecting device.

According to an embodiment of the invention, there is provided a lithographic apparatus for carrying out a lithographic process, which lithographic process involves an exchangeable object, the lithographic apparatus including: an illumination system for providing a beam of radiation; a support structure for supporting a patterning device, the patterning device serving to impart the beam of radiation with a pattern in its cross-section; a substrate table for holding a substrate; a projection system for projecting the patterned beam onto a target portion of the substrate; a robot for exchanging the exchangeable object having a base part and a movable part, the movable part being moveably connected to the base part and including an object handler for handling the exchangeable object, and a detection device or object detector for detection of the exchangeable object in the object handler, the detection device comprising a transmitter for transmitting a signal and a receiver for receiving a signal, the transmitter and the receiver being arranged separate from the movable part of the robot.

A lithographic apparatus in accordance with another embodiment of the invention includes an illumination system configured to condition a beam of radiation; a support structure configured to support a patterning device, the patterning device configured to impart the beam of radiation with a pattern in its cross-section; a substrate table configured to hold a substrate; a projection system configured to project the patterned beam onto a target portion of the substrate; a robot configured to exchange an exchangeable object, the robot including a base part and a movable part, the movable part being movably connected to the base part and including an object handler configured to handle the exchangeable object, and an object detector configured to detect the exchangeable object in the object handler, the detection device including a transmitter configured to transmit a signal and a receiver configured to receive a signal, the transmitter and the receiver being positioned separately from the movable part of the robot.

By arranging a transmitter and a receiver not on the movable part of the robot, but elsewhere in the lithographic apparatus, for example, on the base part of the robot or on a stationary part of the lithographic apparatus, such as a supporting frame, no cabling has to be provided to a sensor arranged on or next to the object handler. As a result, the exchangeable object can be detected without restricting the freedom of movement of the moving part of the robot and without generating particles or molecular contamination near the exchangeable object due to the movement and outgassing of the cabling material.

The signal can be of any suitable type that can travel through a space without the need of a guiding element which extends along a certain path, such as a cable or a guiding element, e.g. an optical fibre. The term "transmitter" as used herein broadly refers to a "wireless transmitter" which can wireless transmit a signal, whereby a certain response to this signal can be received by the receiver. Possible signals may be electrical, magnetic or ultrasound, or any combination thereof.

In an embodiment of the invention, the transmitter is an optical transmitter capable of transmitting an optical signal and the receiver is an optical receiver capable of receiving an optical signal. An optical signal has proven to be very suitable. An optical signal, such as a light beam, in particular a laser beam, can follow a substantially straight line without the need for a guiding element. The optical signal can be easily directed in another direction by providing mirror surfaces or other optical devices like prisms.

In an embodiment of the invention, the lithographic apparatus includes a process chamber, the robot being at least partially arranged in the process chamber, the transmitter and the receiver being arranged outside the process chamber.

The term "process chamber" as used herein broadly refers to a chamber having a space wherein certain process conditions such as, for example a vacuum, are maintained. Such chamber has to be substantially sealed from the environment in order to obtain and control the process conditions.

By placing the transmitter and the receiver outside the process chamber, no (electric) cabling for energizing and linking the transmitter and the receiver to a signal processing unit, e.g. a computer, or any other electronic equipment such as connectors or sensorboards has to be provided in the process chamber. As a consequence, it is not necessary to provide a feed-through in the wall of the process chamber. Also, as the cabling is placed outside the process chamber, the outgassing of the cabling material, which may occur in a vacuum environment, will not occur in the process chamber. Therefore, no particles from the cabling material will be generated in the process chamber.

In the case, the wall of the process chamber stops the signal, a window which allows the signal to pass the wall of the process chamber may be provided in the wall of the process chamber.

In an embodiment of the invention, the movable part of the robot includes one or more arms, a proximal end of a first arm of the one or more arms being rotatably connected to the base part, the object handler being arranged on a distal end of the one or more arms.

In another embodiment of the invention, a first linkage between the base part and the first arm includes a mirror surface configured to direct an optical signal from the transmitter in the direction of the object handler.

The mirror surface may then be connected to the base part, e.g. when a unidirectional robot is used in which the object handler is moved along a substantially straight line. In that case, the mirror surface can be arranged in such a way that the signal is directed along the line on which the object handler can move.

The mirror surface can also be arranged on a proximal part of the first arm at the position of the linkage and be arranged in such a way that the signal is always directed to the distal end of the first arm. Such arrangement may be useful when the object handler is arranged on the distal end of the first arm or if a further mirror surface is arranged on the distal end of the first arm so that the signal can be directed in another further direction, such as from the proximal end of a second arm which is connected to the first arm to a distal end of this second arm.

In another embodiment of the invention, the movable part includes two or more arms, the two or more arms being rotatably connected to each other by further linkages, each of the first and further linkages including at least one mirror surface for directing an optical signal from the transmitter via each of the mirror surfaces to the object handler. When an object in the object handler can be moved in more than one direction by the robot, the signal should be directed to the object handler in all positions of the object handler. By providing mirror surfaces on all linkages between the respective arms of the robot the signal can be guided along the arms of the robot and therefore always be directed to the object handler irrespective of its position.

In an embodiment of the invention, it is possible to control the direction in which a signal is transmitted in such a way that the signal transmitted by a transmitter is always directly directed to the object handler, for example, by a control unit which stores and updates the position of the object handler so that the signal can be directed towards the object handler, and can direct the signal to this known position, for example, by rotating or otherwise moving the transmitter.

In an embodiment of the invention, the robot includes an absorber configured to absorb the signal, which absorber is arranged in such a way that the signal is absorbed by the absorber, when no exchangeable object is present in the object handler.

This arrangement can be used, for example, with a reflective object. When an object is present in the object handler, the signal will be reflected and can be received by the receiver. When, on the other hand, no object is present in the object handler, the signal is transmitted through the space where the object would be held and the absorber will absorb the signal. Thus, the receiver will then not receive the signal which was transmitted by the transmitter. As a result, it will be clear when an object is present in the object handler.

When, instead of a reflective object, an exchangeable object that absorbs the signal transmitted by the transmitter is used, the robot may include a reflector configured to reflect the signal, which reflector is arranged in such a way that the optical signal is reflected by the reflector, when no exchangeable object is present in the object handler.

If the exchangeable object does not have an absorbent or reflective property for the signal used, this property can also be obtained by providing a piece of material with the desired property on the object.

In an embodiment of the invention, the detection device or object detector can detect the presence of an exchangeable object in the object handler. In another embodiment of the invention, the detection device or object detector can detect the identity of the object. The identity can be detected, for example, by providing a barcode on the object which can be read by the receiver. Such barcode can be used, for example, to check whether the proper patterning device is held by the object handler when this patterning device is exchanged with the support structure for a subsequent illumination, or to check a unique identity code of different substrates.

According to another embodiment of the invention, there is provided a device manufacturing method including: in an operational phase, providing a beam of radiation using an illumination system; using a patterning device to impart the beam of radiation with a pattern in its cross-section; and projecting the patterned beam of radiation onto a target portion of a substrate; and in exchanging phase, exchanging an exchangeable object, such as a substrate or a patterning device, using a robot, whereby the presence or identity of the exchangeable object in the robot can be detected by a detection device or object detector, the detection device or object detector including a transmitter for transmitting a signal and a receiver for receiving a signal, the transmitter and the receiver being arranged separate from a movable part of the robot.

A device manufacturing method according to an embodiment of the invention includes patterning a beam of radiation; projecting the patterned beam of radiation onto a target portion of a substrate, and exchanging an exchangeable object using a robot, the exchanging including: detecting a presence of the exchangeable object in the robot using an object detector, the object detector including a transmitter configured to transmit a signal and a receiver configured to receive a signal, the transmitter and the receiver being positioned separately from a movable part of the robot.

According to a further embodiment of the invention, there is provided an apparatus for processing an exchangeable object, having a robot for exchanging the exchangeable object, the robot including a base part and a movable part, the movable part being moveably connected to the base part and including an object handler for handling an exchangeable object, wherein the apparatus includes a detection device or object detector configured to detect an exchangeable object in the object handler, the detection device including a transmitter for transmitting a signal and a receiver for receiving a signal, the transmitter and the detector being arranged separate from the movable part of the robot.

An apparatus for processing an exchangeable object according to an embodiment of the invention includes a robot configured to exchange the exchangeable object, the robot including a base part and a movable part, the movable part being moveably connected to the base part and including an object handler configured to handle an exchangeable object, and an object detector configured to detect the exchangeable object in the object handler, the object detector including a transmitter configured to transmit a signal and a receiver configured to receive a signal, the transmitter and the detector being positioned separately from the movable part of the robot An apparatus configured to exchange an object, according to an embodiment of the invention includes a moveable part moveably connected to a stationary part, the moveable part including an arm, a first portion of the arm being moveably connected to the stationary part; an object holder configured to hold an object, the object holder being arranged on a second portion of the arm; and an object detector in optical communication with the object holder, wherein the moveable part carries an optical element configured to relay an optical signal between the object detector and the object holder.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (E UV) radiation (e.g. having a wavelength in the range of 5–20 nm), as well as particle beams, such as ion beams or, electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning means".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
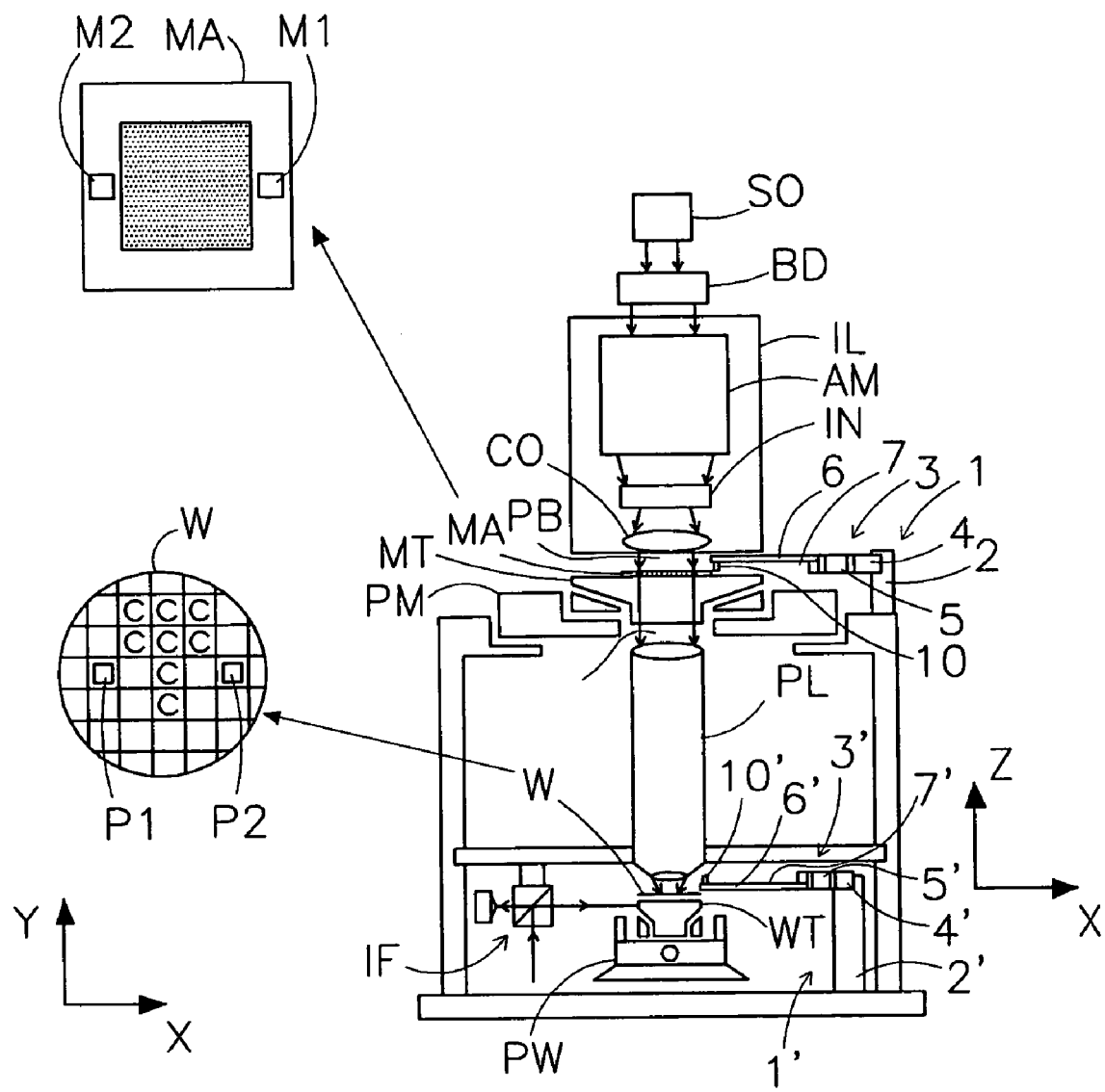
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation) and a first support structure (e.g. a mask table) MT configured to support a patterning device (e.g. a mask) MA and connected to a first positioning device PM configured to accurately position the patterning device with respect to item PL ("lens"). The apparatus also includes a substrate table (e.g. a wafer table) WT configured to hold a substrate (e.g. a resist-coated wafer) W and connected to a second positioning device PW configured to accurately position the substrate with respect to item PL ("lens"), and a projection system (e.g. a refractive projection lens) PL configured to image a pattern imparted to the beam of radiation PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example, when the source is a mercury lamp. The source SO and the illuminator IL, together with the beam delivery system BD, if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The beam of radiation PB is incident on the mask MA, which is held on the mask table MT. Having traversed the mask MA, the beam of radiation PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

Step mode: the mask table MT and the substrate table WT are kept essentially stationary, while an entire pattern imparted to the projection beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

FIG. 1 shows a first robot 1 configured to exchange a mask MA with the mask table MT, and a second robot 1' configured to exchange a wafer W with the wafer table WT. For all parts of both robots 1, 1' the same reference numerals have been used, whereby the reference numerals referring to the substrate robot have been provided with inverted commas.

Hereinafter, robot 1 configured to transfer masks will be described in more detail. The substrate robot 1' generally includes the same parts as robot 1 and generally functions the same way as robot 1. Therefore, it will be appreciated that the following description related to robot 1 could also be applied to robot 1', which is configured to exchange a substrate W.

Figure 2:
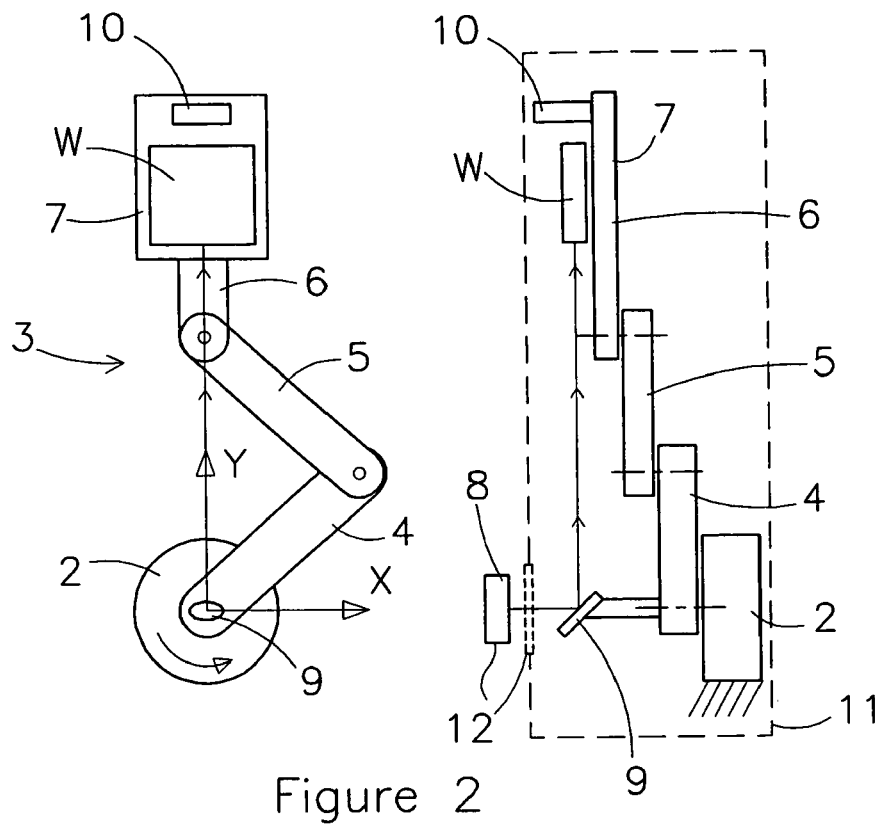
FIGS. 2a and 2b depict schematically, but in more detail, the robot and detection device (or object detector) of FIG. 1 in accordance with an embodiment of the invention.

Robot 1 is depicted in more detail in FIG. 2. Robot 1 includes a base part 2 which is connected to a supporting frame of the lithographic apparatus, and a movable part 3 which is movably connected to the base part 2. The movable part 3 includes three arms 4, 5, and 6. A proximal end of a first arm 4 is rotatably connected to the base part 2. A distal end of the first arm 4 is rotatably connected to a proximal end of a second arm 5, which also includes a distal end that is connected to a proximal end of a third arm 6. On a distal end of the third arm 6, an object handler 7 configured to handle the mask MA is arranged. The object handler 7 includes a handling system, for example gripper elements, vacuum elements or an electrostatic clamp with which the mask MA can be held.

The robot 1 is a unidirectional type robot, which means that the object handler 7 and therefore a mask MA which is held therein, can only be moved by the robot 1 along one axis (Y direction as indicated in FIG. 2).

The lithographic apparatus includes a detection device or object detector which is configured to detect if a mask MA is present in the object handler. The detection device or object detector includes a transmitter configured to transmit an optical signal such as a laser beam and a receiver configured to receive an optical signal in response to the signal transmitted by the transmitter.

The transmitter and the receiver have been integrated in a single sensor housing 8. The sensor housing 8 is arranged on a supporting frame of the lithographic apparatus. The sensor housing is connected via cabling to an energy source to provide energy to the transmitter and possibly the receiver, and to connect the receiver with a signal processing unit such as a computer.

The transmitter transmits an optical signal in the direction of a mirror surface 9 that is arranged on the linkage between the base part 2 and the movable part 3 of the robot 1. The mirror surface 9 is connected to the base part 2 and is arranged in such a way that the optical signal coming from the transmitter is reflected in the direction of the object handler 7. The direction of the reflected signal is the same as the direction in which the object handler 7 can move. The optical signal will therefore always come across the object handler 7. The path of the optical signal is in FIG. 2 indicated with a line with arrow points.

The mirror surface 9 is thus used to direct the optical signal in the line of movement of the object handler 7. It is also possible to arrange the sensor housing 8 in such a way that the optical signal coming from the transmitter is directly directed in the direction of movement of the object handler 7. The possibilities of placement of the sensor housing 8 are in such arrangement however limited as the sensor housing 8 has to be placed in line with the line of movement of the object handler. Furthermore, it is also possible to use more than one mirror surface to direct the optical signal in the desired direction.

The material of the masks, which is applied in the lithographic apparatus of FIG. 1, may be of a type which absorbs the optical signal transmitted by the transmitter. If a mask MA is present in the object handler 7, an optical signal transmitted by the transmitter will thus be absorbed by the absorbent material of the mask MA. As a result, the receiver will not receive an optical signal back. Thus, when the receiver does not receive a signal, a mask MA is present in the object handler.

If no mask MA is present in the object handler 7 the optical signal transmitted by the transmitter will be reflected by a reflector 10 that is arranged on the object handler 7. The reflected signal is reflected in the opposed direction to the mirror surface 9 and will be received by the receiver after being reflected on the mirror surface 9. Thus, in case the receiver receives an optical signal, this is an indication that there is no mask MA present in the object handler 7.

It will be appreciated that, in FIG. 2, the transmitter and the receiver have been arranged separate from the movable part 3 of the robot 1. Therefore, it is possible to arrange the robot 1 within a process chamber, such as, for example, a vacuum chamber, which is kept under certain process conditions, while at the same time the transmitter and the receiver are arranged outside the process chamber. Due to this arrangement, no electric connection has to be made within the process chamber to energize the sensor and to lead a signal back to a signal processing unit such as a computer.

In FIG. 2 such process chamber is, for example, indicated by a dashed line. The optical signal can enter and if reflected by reflector 10 leave the process environment via a window 12 which is arranged in a wall of the process chamber 11.

It will be appreciated that in case a reflective mask MA is used in a lithographic apparatus, an absorber can be used instead of the reflector 10. In such arrangement, a mask MA is present in the object handler if an optical signal is received by the receiver. If the mask MA does not have the absorbent or reflective property for the used signal, this property can also be obtained by providing the mask MA with a surface or a piece of material with the desired property.

Instead of using a reflector 10 at the object handler 7 it is also possible to arrange the receiver separate from the transmitter on the other side of the robot. In such arrangement, if no mask MA is present in the object handler 7 the optical signal will continue in the same direction and be received by the receiver, which may be arranged, for example, on a supporting frame of the lithographic apparatus.

Figure 3:
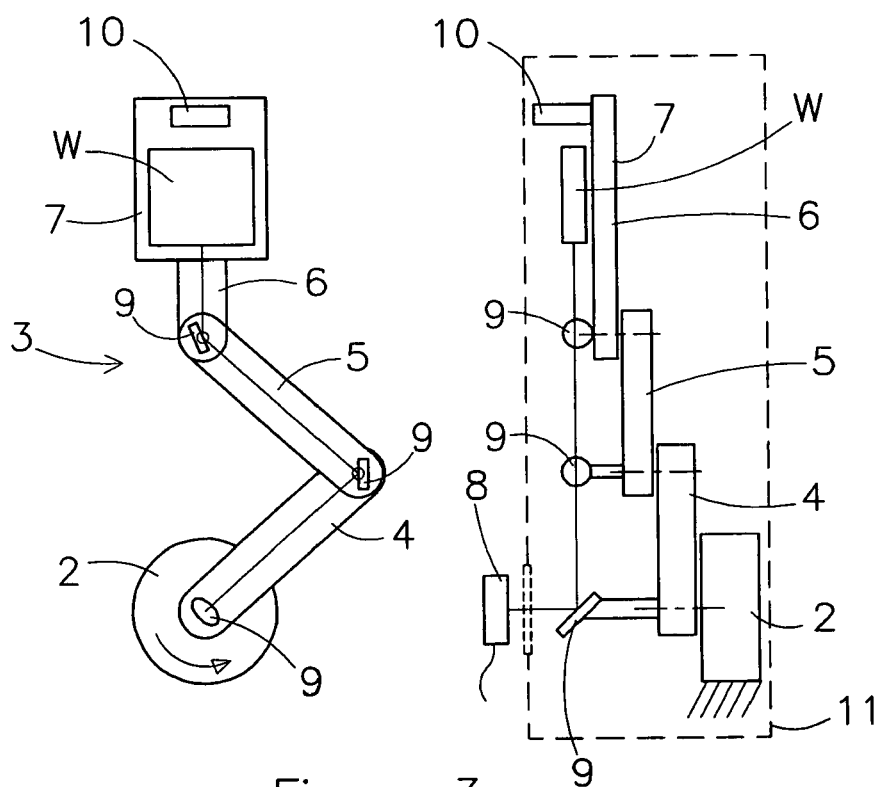
FIGS. 3a and 3b depict schematically a robot and a detection device (or object detector) in accordance with an embodiment of the invention.

FIG. 3 shows a schematic representation of a robot and a detection device or object detector in accordance with an embodiment of the invention. The parts of the robot and detection device or object detector configured to perform the same f unction as in FIG. 1, are indicated with the same reference numerals as in FIG. 1.

The robot 1 includes a base part 2, which is stationary and connected to a supporting frame of the lithographic apparatus, and a movable part 3 which is rotatably connected to the base part 2. The movable part 3 includes three arms 4, 5 and 6, which are rotatably connected to each other.

The movement of the object handler 7 of the robot 1 as shown in FIG. 3 is not restricted to one direction, but the object handler 7 can be moved in any direction in a plane. Since the object handler 7 does not stay within one line in relation to the transmitter, the optical signal has to be guided towards the object handler 7 in order to detect the presence or identity of a mask MA therein.

In order to provide guidance of the optical signal on the linkage between the base part and the first arm 4 and on the two linkages between the first 4 and the second arm 5, and the second 5 and the third arm 6, respectively, mirror surfaces 9 are provided to guide the optical signal transmitted by the transmitter to the object handler 7. Each mirror surface 9 is connected to the proximal end of the respective arm and arranged in such a way that the optical signal reflected by the mirror surface 9 is directed to the distal end of the same arm. In this way, the optical signal is guided along the arms of the movable part 3 of the robot 1 towards the object handler 7, which is arranged on the distal end of the third arm 6.

If the optical signal is reflected by the reflector 9 in absence of a mask MA in the object handler 7, the optical signal is returned via the respective mirror surfaces 9 and received by the receiver which is arranged together with the transmitter in the sensor housing 8. If a mask MA is present in the object holder the signal is absorbed and no (optical) signal will be received by the receiver.

Figure 4:
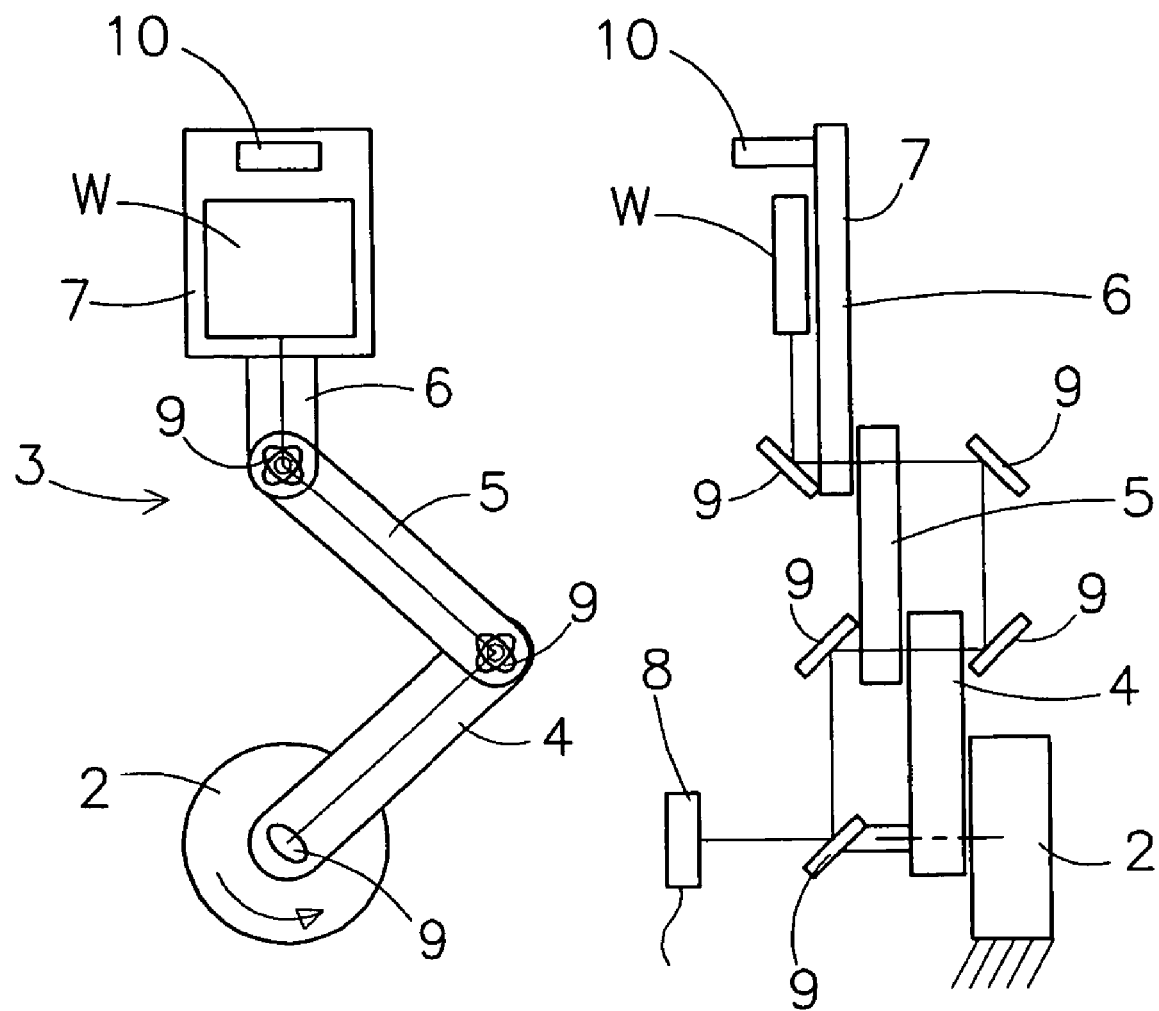
FIGS. 4a and 4b depict schematically a robot and a detection device (or object detector) in accordance with an embodiment of the invention.

FIG. 4 shows a robot and a detection device or object detector in accordance with an embodiment of the invention. The same reference numerals are used for the same parts of robot 1. With the robot 1 of FIG. 4, the object handler 7 can also be moved in a plane. Therefore, the optical signal transmitted by the transmitter is guided along the three arms 4, 5 and 6 of the movable part 2 of the robot 1. Instead of using one mirror surface 9 per linkage, two mirror surfaces 9 are provided on each linkage between a distal end of a proximal arm and a proximal end of a distal arm.

At least one of the mirror surfaces 9 is connected to the proximal end of the distal arm, so that the signal is guided in the direction of the distal end of the same arm. The other mirror surface 9 may be connected to the distal end of the proximal arm or, as an alternative, to the proximal end of the distal arm. The advantage of two mirror surfaces on one linkage is that the path of the signal can be kept close to the arms. Further, it is possible to change the side of the arms along which the signals travel. The latter arrangement provides even more freedom in the design of the movable part 2 of the robot 1.

In the above embodiments of the invention, a robot 1 has been described in relation with the exchange of masks with the mask table MT. Similar robots with similar detection devices (or object detectors) could also be used for a wafer disposed on a wafer table WT, as indicated before, or for any other exchangeable object, whereby it is important to know whether an object is present in the object handler of the robot. Moreover, robots as described can be used in any other apparatus wherein an exchangeable object is manipulated by a robot.

Further it will be appreciated that the detection device (or object detector) could be used to detect the identity of the object in the object handler, for example, when barcodes are placed on the exchangeable objects which barcodes can be read by the signal returning from the signal sent by the transmitter.

While specific embodiments of the invention have been described above, it will be appreciated that the invention may be practiced otherwise than as described. The description is not intended to limit the invention.

What is claimed is:

1. A lithographic apparatus, comprising:
   an illumination system configured to condition a beam of radiation;
   a support structure configured to support a patterning device, the patterning device configured to impart the beam of radiation with a pattern in its cross-section;
   a substrate table configured to hold a substrate;
   a projection system configured to project the patterned beam of radiation onto a target portion of the substrate;
   a robot configured to exchange an exchangeable object, the robot including a base part and a movable part, the movable part being movably connected to the base part and comprising an object handler configured to handle the exchangeable object, and
   an object detector configured to detect the exchangeable object in the object handler, the object detector comprising a transmitter configured to transmit a signal, said signal being transmitted to said object handler, and a receiver configured to receive a signal, the transmitter and the receiver being positioned separately from the movable part of the robot.

2. The lithographic apparatus of claim 1, wherein the transmitter and the receiver are arranged on the base part of the robot.

3. The lithographic apparatus of claim 1, further comprising a substantially stationary part, wherein the transmitter and the receiver are arranged on the stationary part.

4. The lithographic apparatus of claim 3, wherein the substantially stationary part is a frame of said lithographic apparatus.

5. The lithographic apparatus of claim 1, further comprising a process chamber, wherein the robot is at least partially arranged in the process chamber, and wherein the transmitter and the receiver are arranged outside the process chamber.

6. The lithographic apparatus of claim 5, wherein the process chamber is a vacuum chamber.

7. The lithographic apparatus of claim 1, wherein the transmitter is an optical transmitter configured to transmit an optical signal and the receiver is an optical receiver configured to receive an optical signal.

8. The lithographic apparatus of claim 1, wherein the movable part includes one or more arms, wherein a proximal end of a first arm of the one or more arms is rotatably connected to the base part, and wherein the object handler is arranged on a distal end of the one or more arms.

9. The lithographic apparatus of claim 8, wherein a mirror surface is arranged on a first linkage between the base part and the first arm, the mirror surface being configured to direct a signal from the transmitter in the direction of the object handler.

10. The lithographic apparatus of claim 8, wherein the movable part comprises two or more arms, the two or more arms being rotatably connected to each other by a plurality of linkages, wherein at least one mirror surface is arranged on each of the plurality of linkages, the at least one mirror surface being configured to direct a signal from the transmitter via each of the mirror surfaces to the object handler.

11. The lithographic apparatus of claim 1, wherein the robot comprises an absorber configured to absorb a signal, wherein said absorber is arranged such that the signal is absorbed by the absorber when no exchangeable object is present in the object handler.

12. The lithographic apparatus of claim 1, wherein the robot comprises a reflector configured to reflect the signal, wherein said reflector is arranged such that the signal is reflected by the reflector when no exchangeable object is present in the object handler.

13. The lithographic apparatus of claim 1, wherein the transmitter and the receiver are integrated in a single sensor device.

14. The lithographic apparatus of claim 1, wherein the object detector is configured to detect the presence of the exchangeable object in the object handler.

15. The lithographic apparatus of claim 1, wherein the object detector is configured to identify the exchangeable object in the object handler.

16. The lithographic apparatus of claim 1, wherein the exchangeable object is the substrate.

17. The lithographic apparatus of claim 1, wherein the exchangeable object is the patterning device.

18. A device manufacturing method comprising:
patterning a beam of radiation;
projecting the patterned beam of radiation onto a target portion of a substrate, and
exchanging an exchangeable object using a robot, said exchanging including:
detecting a presence of the exchangeable object in the robot using an object detector, the object detector comprising a transmitter configured to transmit a signal, said signal being transmitted to said object handler, and a receiver configured to receive a signal, the transmitter and the receiver being positioned separately from a movable part of the robot.

19. The method of claim 18, wherein said exchanging further comprises identifying said exchangeable object.

20. The method of claim 18, wherein the exchangeable object is the substrate or a patterning device.

21. An apparatus for processing an exchangeable object, comprising:
a robot configured to exchange the exchangeable object, the robot comprising a base part and a movable part, the movable part being moveably connected to the base part and comprising an object handler configured to handle an exchangeable object, and
an object detector configured to detect the exchangeable object in the object handler, the object detector comprising a transmitter configured to transmit an optical signal, said optical signal being transmitted to said object handler, and a receiver configured to receive a signal, the transmitter and the receiver being positioned separately from the movable part of the robot.

22. An apparatus configured to exchange an object, comprising:
a moveable part moveably connected to a stationary part, said moveable part including an arm, a first portion of the arm being moveably connected to the stationary part;
an object holder configured to hold an object, said object holder being arranged on a second portion of the arm; and
an object detector in optical communication with said object holder,
wherein said moveable part carries an optical element configured to relay an optical signal output by said object detector between said object detector and said object holder.

23. The apparatus of claim 22, wherein said optical element is arranged on said arm such that said optical signal is transmitted substantially along said arm.

24. The apparatus of claim 23, further comprising another arm, and wherein said optical element is arranged at a junction between said arms.

25. The apparatus of claim 22, wherein the object detector is arranged on said stationary part.

26. The apparatus of claim 1, wherein said receiver is adapted to receive the signal transmitted by said transmitter.

* * * * *